(12) United States Patent
Li et al.

(10) Patent No.: US 9,443,726 B1
(45) Date of Patent: Sep. 13, 2016

(54) SEMICONDUCTOR PROCESS

(71) Applicant: UNITED MICROELECTRONICS CORP., Hsin-Chu (TW)

(72) Inventors: Kun-Ju Li, Tainan (TW); Po-Cheng Huang, Kaohsiung (TW); Yu-Ting Li, Chiayi (TW); Jen-Chieh Lin, Kaohsiung (TW); Chih-Hsun Lin, Ping-Tung County (TW); Tzu-Hsiang Hung, Kaohsiung (TW); Wu-Sian Sie, Tainan (TW); I-Lun Hung, Kaohsiung (TW); Wen-Chin Lin, Tainan (TW); Chun-Tsen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/656,733

(22) Filed: Mar. 13, 2015

(51) Int. Cl.
*H01L 21/02* (2006.01)
*H01L 21/324* (2006.01)
*H01L 21/321* (2006.01)
*H01L 21/66* (2006.01)

(52) U.S. Cl.
CPC ... *H01L 21/02362* (2013.01); *H01L 21/02271* (2013.01); *H01L 21/02354* (2013.01); *H01L 21/324* (2013.01); *H01L 21/3212* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 4,415,794 A | 11/1983 | Delfino | |
| 6,368,906 B1 * | 4/2002 | Shin | 438/210 |
| 6,399,461 B1 * | 6/2002 | Liu | 438/436 |
| 7,888,273 B1 | 2/2011 | Wang | |
| 2011/0312180 A1 * | 12/2011 | Wang | 438/692 |
| 2015/0118863 A1 * | 4/2015 | Rathod | 438/778 |

\* cited by examiner

*Primary Examiner* — Charles Garber
*Assistant Examiner* — Alia Sabur
(74) *Attorney, Agent, or Firm* — Winston Hsu; Scott Margo (57) ABSTRACT

A semiconductor process includes the following steps. A dielectric layer is formed on a substrate, where the dielectric layer has at least a dishing from a first top surface. A shrinkable layer is formed to cover the dielectric layer, where the shrinkable layer has a second top surface. A treatment process is performed to shrink a part of the shrinkable layer according to a topography of the second top surface, thereby flattening the second top surface.

20 Claims, 8 Drawing Sheets

SEMICONDUCTOR PROCESS

BACKGROUND OF THE INVENTION

1. Field of the Invention

The present invention relates generally to a semiconductor process, and more specifically to a semiconductor process planarizing a dielectric layer by treating a shrinkable layer covering the dielectric layer.

2. Description of the Prior Art

In the semiconductor industry, chemical mechanical polishing (CMP) is the most common and important planarization tool applied. For example, CMP processes have been widely adopted in shallow trench isolation (STI) processes or copper (Cu) interconnection etc.

Generally, the CMP process can be used to remove a topographical target of a thin film layer on a semiconductor wafer and to produce a wafer with both a regular and planar surface. In a CMP process, slurry is provided in a surface subject to planarization, and a mechanical polishing process is performed on the surface of the wafer. The slurry includes chemical agents and abrasives. The chemical agents may be PH buffers, oxidants, surfactants or the like, and the abrasives may be silica, alumina, zirconium oxide, or the like. The chemical reactions evoked by the chemical agents and the abrasion between the wafer, the abrasives, and the polishing pad can planarize the surface of the wafer.

SUMMARY OF THE INVENTION

The present invention provides a semiconductor process, which forms a shrinkable layer on a dielectric layer, and treats the shrinkable layer to have a flat top surface. Therefore, the dielectric layer can also have a flat top surface by planarizing the shrinkable layer to expose it.

The present invention provides a semiconductor process including the following steps. A dielectric layer is formed on a substrate, wherein the dielectric layer has at least a dishing from a first top surface. A shrinkable layer is formed to cover the dielectric layer, wherein the shrinkable layer has a second top surface. A treatment process is performed to shrink a part of the shrinkable layer according to a topography of the second top surface, thereby flattening the second top surface.

According to the above, the present invention provides a semiconductor process, which forms a shrinkable layer directly on a dielectric layer having at least a dishing from a top surface, thereby the shrinkable layer also has a top surface having at least a dishing; then, performs a treatment process to flatten the top surface of the shrinkable layer according to its topography. Thus, the dielectric layer can have a flat top surface by planarizing the shrinkable layer until exposing the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
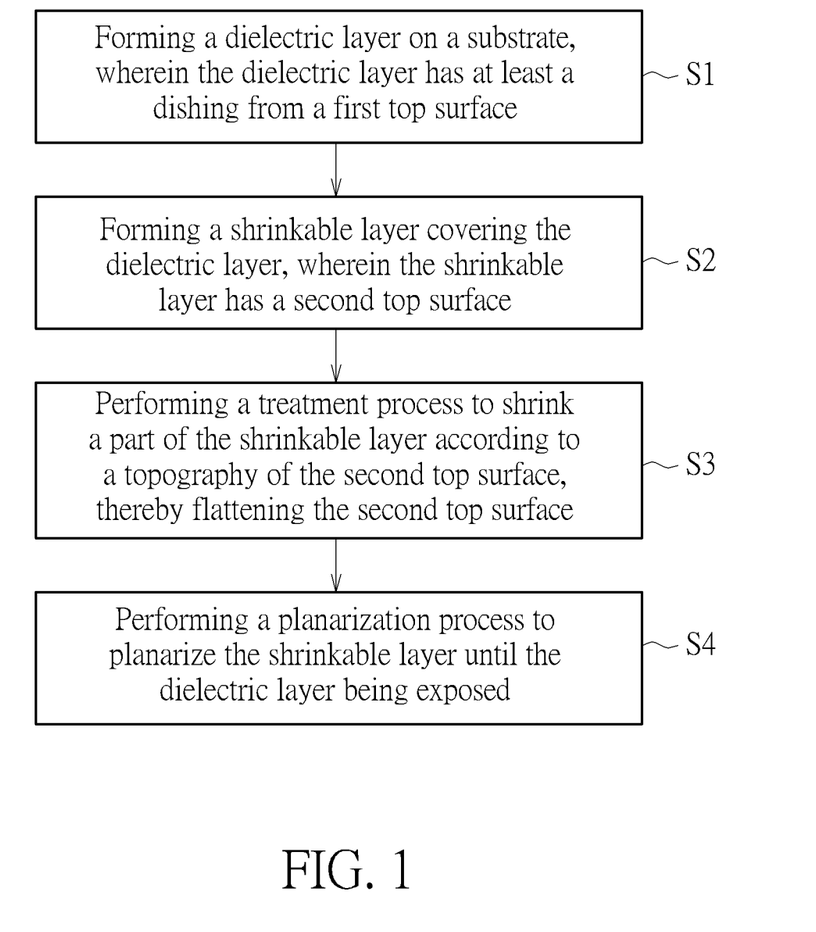
FIG. 1 schematically depicts a flow chart of a semiconductor process according to an embodiment of the present invention.

The present invention is applied to a metal gate process in the following embodiment. However, the present invention can also be applied to any other semiconductor processes, which include steps of flattening layers. FIG. 1 schematically depicts a flow chart of a semiconductor process according to an embodiment of the present invention. FIGS. 2-7 schematically depict cross-sectional views of a semiconductor process according to an embodiment of the present invention.

Figure 2:
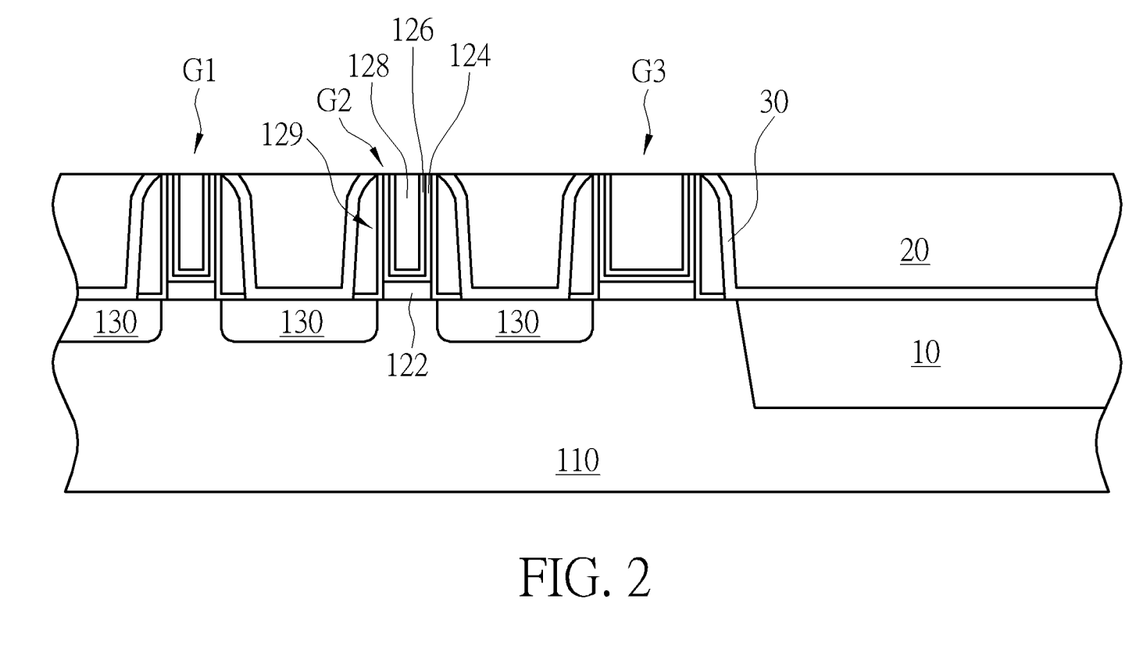
FIGS. 2-7 schematically depict cross-sectional views of a semiconductor process according to an embodiment of the present invention.

According to Step S1 of FIG. 1—forming a dielectric layer on a substrate, wherein the dielectric layer has at least a dishing from a first top surface. The dielectric layer on the substrate may include a non-metal layer or a metal layer, depending upon practical requirements. In this embodiment, the dielectric layer is an inter-level dielectric layer, which has gates, especially for metal gates therein, but the present invention is not restricted to be applied in this situation. As shown in FIG. 2, a substrate 110 is provided. The substrate 110 may include a semiconductor substrate, for example, a silicon substrate, an epitaxial silicon substrate, a silicon germanium substrate, a silicon carbide substrate or a silicon-on-insulator (SOI) substrate, or may include a non-semiconductor substrate such as a glass substrate, but this is not limited thereto. An isolation structure 10 may be formed in the substrate 110 to identify each active area. The isolation structure 10 may be a shallow trench isolation (STI) structure, which may be formed by a shallow trench isolation (STI) process, but it is not limited thereto.

Three metal gate structures G1/G2/G3 are formed in a dielectric layer 20 and on the substrate 110. Each of the metal gate structures G1/G2/G3 may include a high-k gate dielectric layer 122, a work function layer 124, a barrier layer 126, a gate electrode 128 and a spacer 129. Also, a source/drain region 130 is disposed at two sides of each of the metal gate structures G1/G2/G3. The method of forming the metal gate structures G1/G2/G3 may include, but not limited to, the following. Three sacrificial gates (not shown) including high-k gate dielectric layers (not shown), sacrificial gate electrodes (not shown), cap layers (not shown) stacked from bottom to top are formed on the substrate 110 and the spacers 129 are formed beside the sacrificial gates; the source/drain region 130 is formed at two sides of each of the sacrificial gates in the substrate 110; and then, a dielectric layer (not shown) entirely covers the substrate 110. Through a planarization process, such as a chemical mechanical polishing/planarization (CMP) process, an etching process, or a combination of both, a portion of the dielectric layer is then removed to form the dielectric layer 20. The cap layers and the sacrificial gate electrodes are also completely removed to form gate trenches (not shown). A work function material layer (not shown), a barrier material layer (not shown), and a gate electrode material layer (not shown) are sequentially filled in the gate trenches, and a CMP process is carried out to form the work function layers 124, the barrier layers 126 and the gate electrodes 128. Some dishing (not shown) may occur due to above processes such as these CMP processes.

In a preferred embodiment, the high-k gate dielectric layer 122 may include rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but this is not limited thereto. The work function layer 124 and the barrier layer 126 may be formed through a physical vapor deposition (PVD) process, wherein the work function layer 124 may include a P type work function metal, such as a nitride of nickel (Ni), tungsten (W), molybdenum (Mo), tantalum (Ta), or titanium (Ti), or an N type work function metal, such as titanium aluminides (TiAl), aluminum zirconium (ZrAl), aluminum tungsten (WAl), aluminum tantalum (TaAl) or aluminum hafnium (HfAl); and the barrier layer 126 may include Ti/titanium nitride (TiN) or Ta/tantalum nitride (TaN); the dielectric layer 20 may be an oxide layer, but is not limited thereto. People skilled in the art should realize that the metal gate structures G1/G2/G3 of the present invention is not limited to be formed through the above-mentioned steps and materials, and may include other processes or materials.

Furthermore, a contact etching stop layer (CESL) 30 may be formed on the substrate 110 to cover the sacrificial gates before the dielectric layer 20 is formed. The CESL 30 may include a monolayer structure or a multilayer structure, thereby providing required compressive stress or stretching stress to the metal gate structures G1/G2/G3. In one embodiment, the CESL 30 may also be omitted. Also, in another embodiment, a lightly doped source/drain (LDD) region (not shown) may be formed in the substrate 100 before the spacer 129 is formed according to practical requirements.

Figure 3:
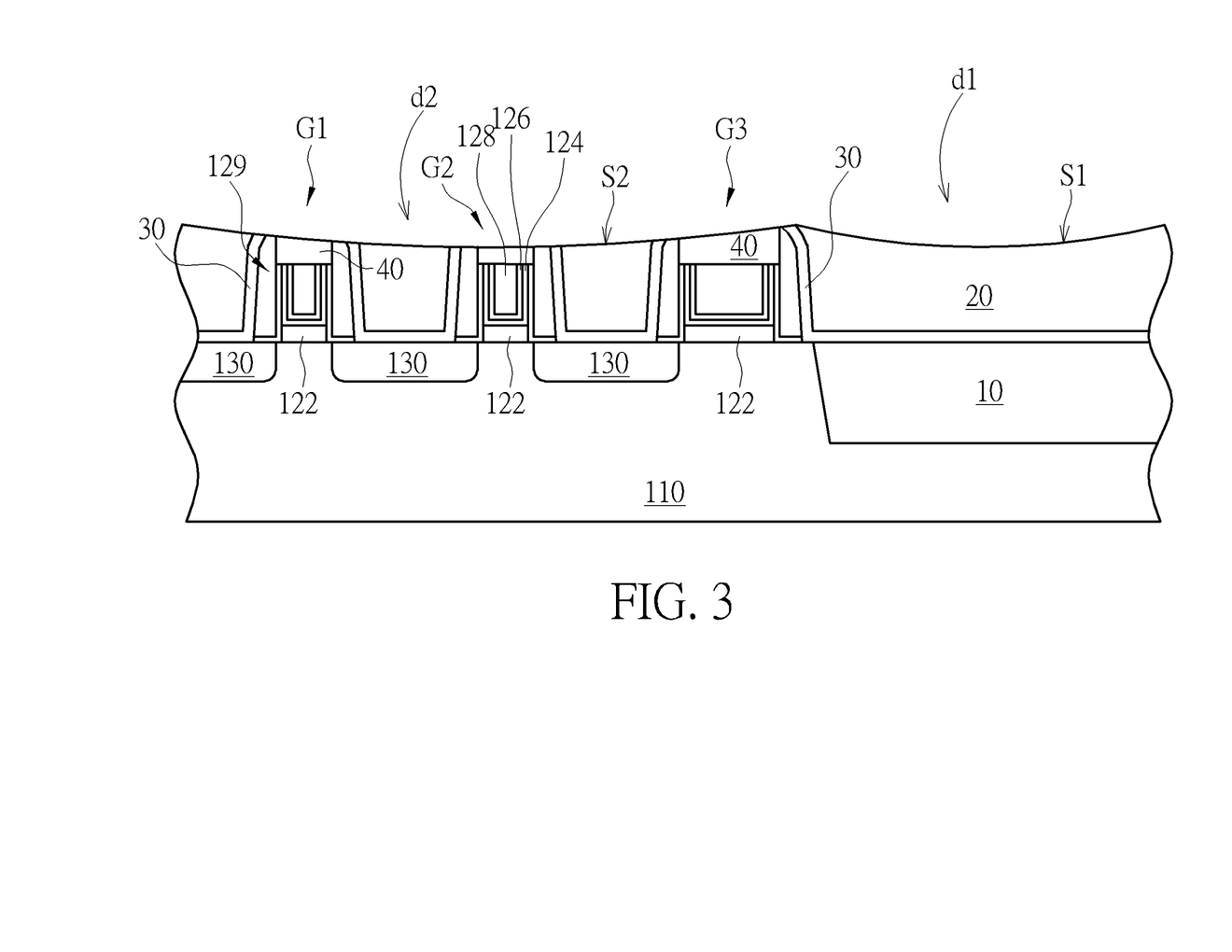

Moreover, an etching back process is carried out to partially remove the work function layers 124, the barrier layers 126, and the gate electrodes 128, to form trenches (not shown). Then, cap layers 40 are formed in the trenches on the work function layers 124, the barrier layers 126 and the gate electrodes 128, as shown in FIG. 3. In the present embodiment, the cap layers 40 may be nitride layers or others.

Under practical circumstances, dishings d1 and d2 occur in a first top surface S1 of the dielectric layer 20 and first top surfaces S2 of the cap layers 40. However, flat top surfaces are required to dispose metal interconnect structures on the dielectric layer 20 and the cap layers 40 in later processes. The number of the dishings d1 and d2 is not restricted to what is shown in the drawings.

Figure 4:
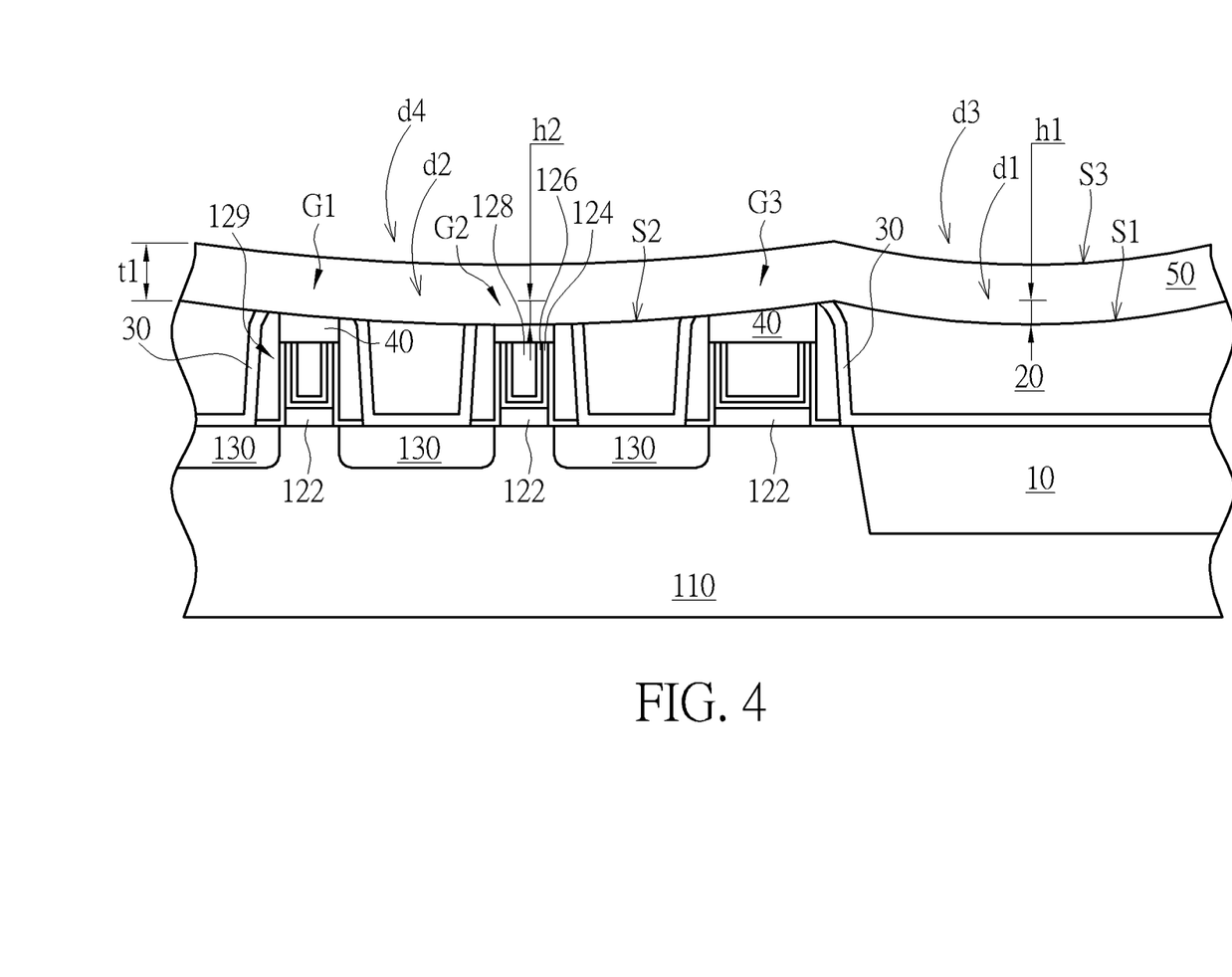

Thus, according to Step S2 of FIG. 1—forming a shrinkable layer covering the dielectric layer, wherein the shrinkable layer has a second top surface. As shown in FIG. 4, a shrinkable layer 50 blanketly covers the dielectric layer 20 and the cap layers 40. Since the first top surface S1 of the dielectric layer 20 and the first top surfaces S2 of the cap layers 40 have dishings d1 and d2, a second top surface S3 of the shrinkable layer 50 inherently has dishings d3 and d4 as well.

Preferably, the shrinkable layer 50 may be an oxide layer, which may be preferably formed by a flowable chemical vapor deposition (FCVD) process. Thereby volumes of the shrinkable layer 50 can be partially shrank through treatments, but it is not limited thereto. In a preferred embodiment, a thickness t1 of the shrinkable layer 50 is larger than depths h1/h2 of the dishings d1/d2, so that the dishings d1/d2 can be full filled by the shrinkable layer 50, and thus flat top surfaces of the dielectric layer 20 and the cap layers 40 can be obtained through later processes of the present invention.

Figure 5:
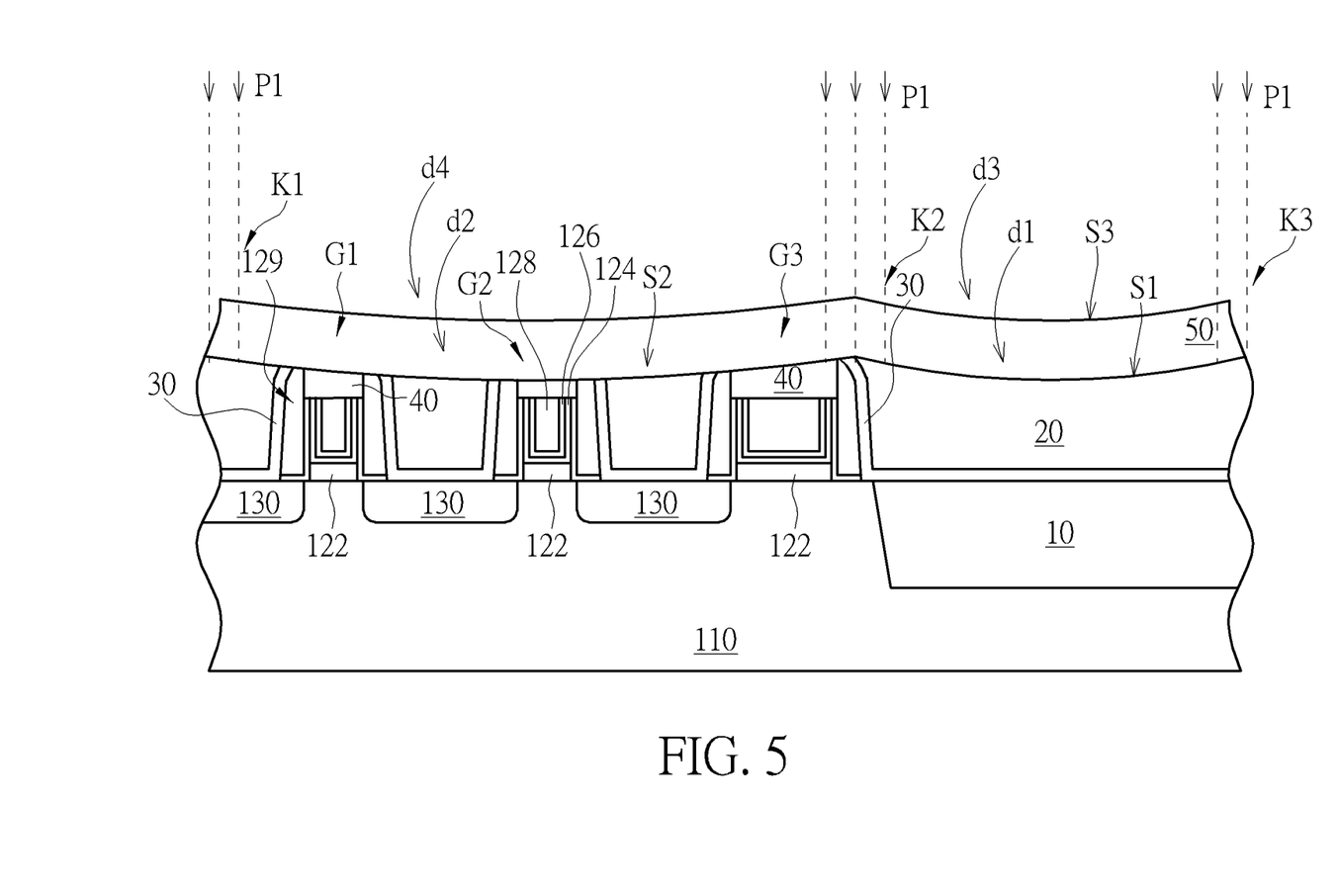

According to Step S3 of FIG. 1—performing a treatment process to shrink a part of the shrinkable layer according to a topography of the second top surface, thereby flattening the second top surface. As shown in FIG. 5, a treatment process P1 may be performed to shrink at least a part of the shrinkable layer 50. More precisely, a topography of the second top surface S3 of the shrinkable layer 50 may be measured or obtained firstly, and the treatment process P1 can be performed to shrink the part of the shrinkable layer 50 according to the topography. The topography of the second top surface S3 may be measured by a white light interference method or an atomic force microscopy (AFM) method, but it is not limited thereto. The topography of the second top surface S3 may be measured through scanning the second top surface S3 with concentric circle paths, a spiral path, etc.

In one case, the topography has relative high points k1/k2/k3, and the treatment process P1 may be performed on the relative high points k1/k2/k3 only, to smoothen or flatten the topography, but it is not limited thereto. In another case, the treatment process P1 may be performed on the whole second top surface S3 of the shrinkable layer 50 to flatten the whole second top surface S3.

In a preferred embodiment, the treatment process P1 is a selective curing process, which may only cure a part of the second top surface S3 of the shrinkable layer 50 or cure the whole second top surface S3 of the shrinkable layer 50 with different curing forces. In one case, the treatment process P1 is an annealing process. Preferably, the treatment process P1 is a laser beam annealing process, which is preferably capable of having a power distribution corresponding to every points of the whole second top surface S3, thereby the whole second top surface S3 can be flattened accurately.

In an embodiment, the power distribution of the treatment process P1 is a curve distribution of the power versus the second top surface S3 of the shrinkable layer 50, and the curve distribution of the power preferably covers the whole second top surface S3 to have better flatness; in another embodiment, the power distribution of the treatment process P1 is a point distribution, which only treats some points of the second top surface S3, thereby reducing processing costs, depending upon practical requirements.

Figure 6:
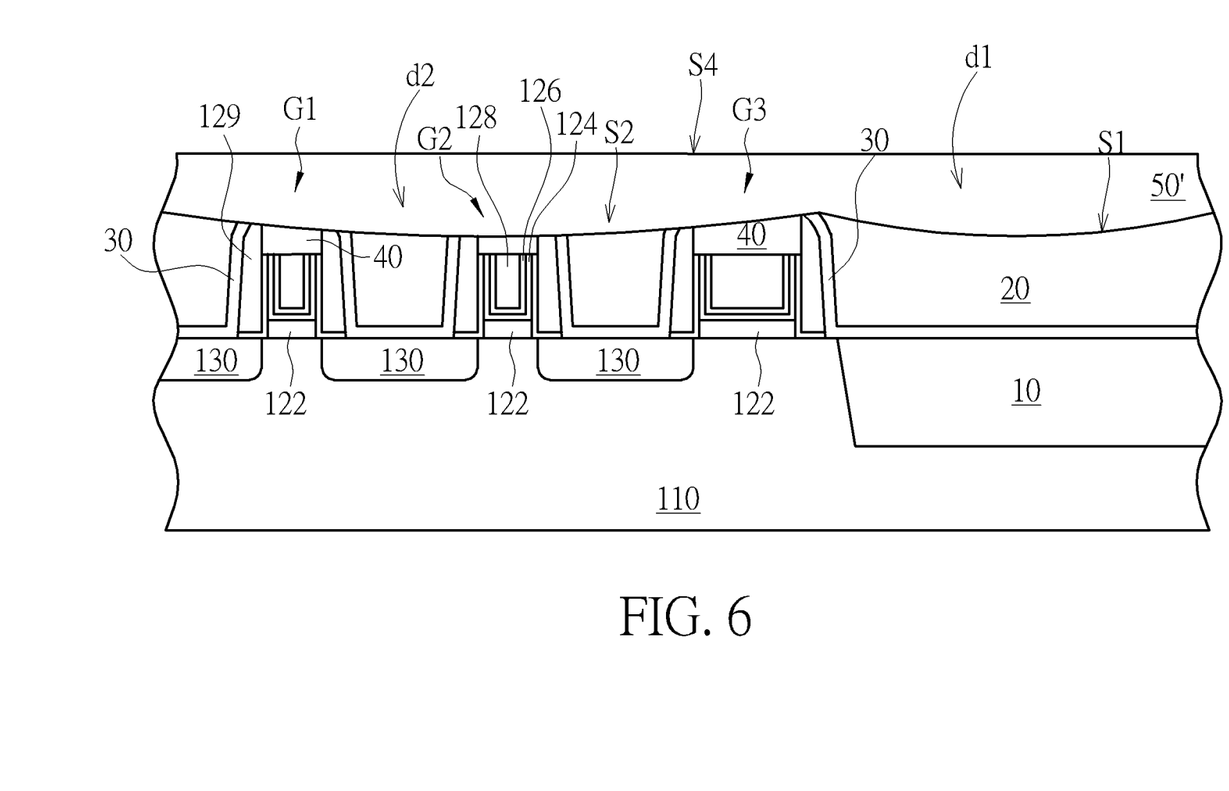

Through the above treatment process P1 of the present invention, the shrinkable layer 50' having a flat top surface S4 can be obtained eventually, as shown in FIG. 6. Then, the flat top surface S4 can be transferred to the dielectric layer 20 and the cap layers 40 below as follows.

Figure 7:
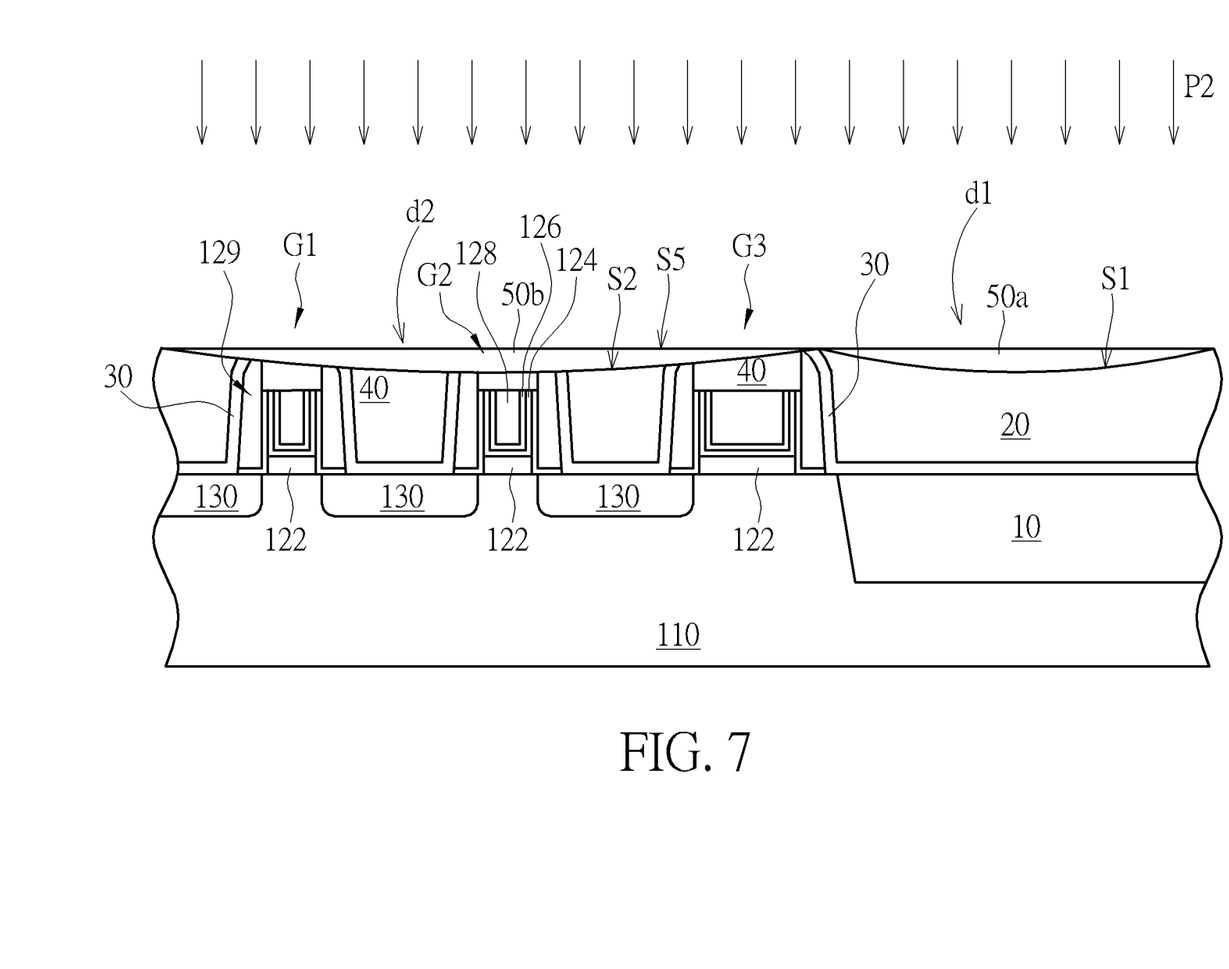
Figure 8:
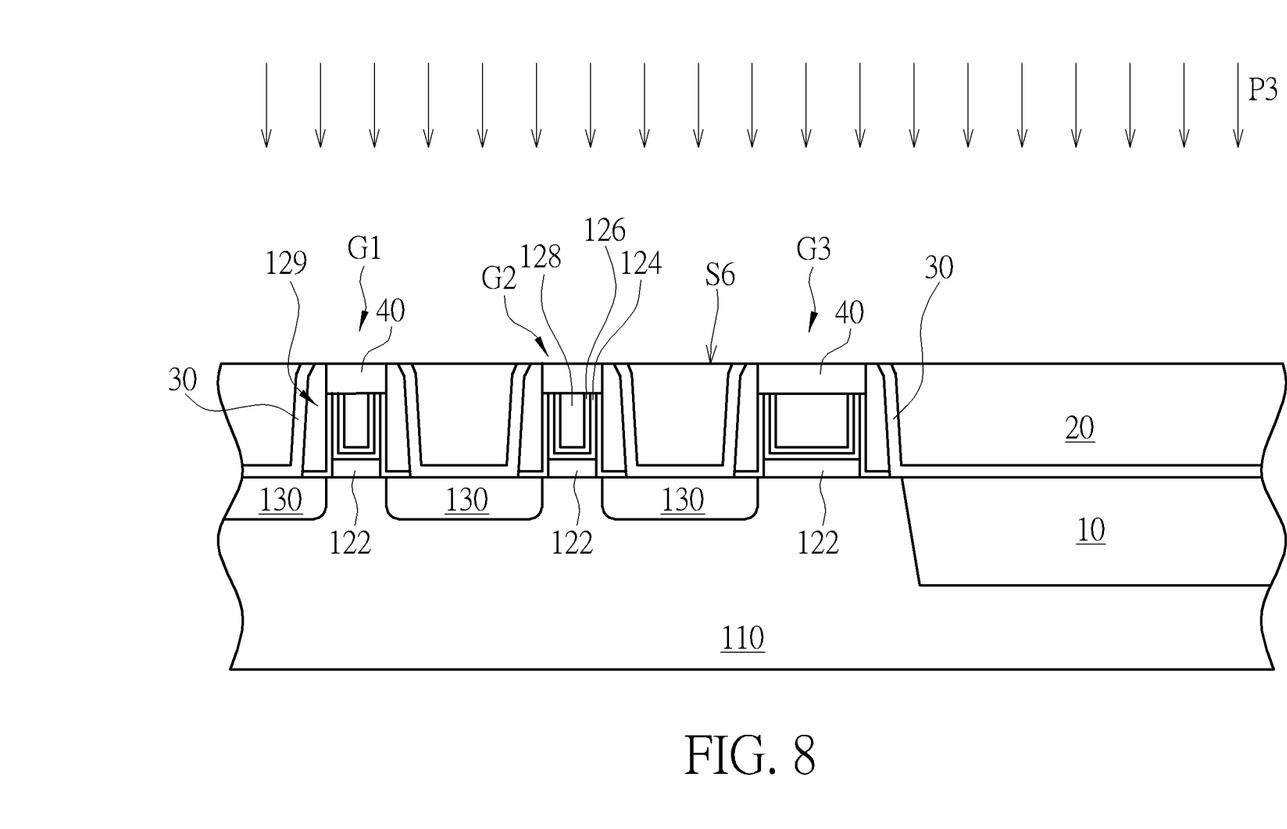
FIG. 8 schematically depicts a cross-sectional view of a semiconductor process according to another embodiment of the present invention.

According to Step S4 of FIG. 1—performing a planarization process to planarize the shrinkable layer until the dielectric layer is exposed. As shown in FIG. 7, a planarization process P2 may be performed to remove a top part of the shrinkable layer 50' until the dielectric layer 20 is exposed, thereby a flat top surface S5 being obtained. It is emphasized that, parts 50a/50b of the shrinkable layer 50' still remain to fill the original dishings d1/d2 of FIG. 3, and thus constituting the flat top surface S5, but it is not limited thereto. In addition, FIG. 8 schematically depicts a cross-sectional view of a semiconductor process according to another embodiment of the present invention. As shown in FIG. 8, a planarization process P3 may be performed to remove all of the shrinkable layer 50' and even a part of the dielectric layer 20 and the cap layers 40 to obtain a flat top surface S6, which is only constituted by the dielectric layer 20 and the cap layers 40 without having the shrinkable layer 50' reserved. In a preferred embodiment, the planarization processes P2/P3 may be chemical mechanical polishing (CMP) processes, wherein the planarization process P3 has more over-polishing time to remove the shrinkable layer 50', but it is not limited thereto.

To summarize, the present invention provides a semiconductor process, which forms a shrinkable layer directly on a dielectric layer having at least a dishing from a top surface, thereby the shrinkable layer also has a top surface having at least a dishing; then, performs a treatment process to flatten the top surface of the shrinkable layer according to its topography. Thus, the dielectric layer can have a flat top surface by planarizing the shrinkable layer to expose it.

The shrinkable layer may be an oxide layer, which may be formed by a flowable chemical vapor deposition (FCVD) process. The topography of the top surface of the shrinkable layer may be measured by a white light interference method or an atomic force microscopy (AFM) method.

In an embodiment, the treatment process may be performed on some relative high points of the top surface of the shrinkable layer only, or may be performed on the whole shrinkable layer to flatten the whole top surface. The treatment process may be a selective curing process. In one case, the treatment process is an annealing process. Preferably, the treatment process is a laser beam annealing process, which may have a power distribution corresponding to the whole top surface of the shrinkable layer. The power distribution may be a curve distribution of the power versus the top surface of the shrinkable layer, or may be a point distribution, which only treats some points of the top surface of the shrinkable layer.

The shrinkable layer is planarized until the dielectric layer is exposed to get a flat top surface of the dielectric layer. In one case, a part of the shrinkable layer still remains to constitute a part of the flat top surface of the dielectric layer. In another case, all of the shrinkable layer is removed and a part of the dielectric layer may be removed as well to get the flat top surface of the dielectric layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a dielectric layer on a substrate, wherein the dielectric layer has at least a dishing from a first top surface;
    forming a shrinkable layer covering the dielectric layer, wherein the shrinkable layer has a second top surface; and
    performing a treatment process to shrink at least a part of the shrinkable layer selectively, corresponding to a topography of the second top surface, thereby flattening the second top surface.

2. The semiconductor process according to claim 1, wherein the dielectric layer has a trench, and a metal gate and a cap layer are stacked in the trench from bottom to top.

3. The semiconductor process according to claim 2, wherein the cap layer has at least a dishing.

4. The semiconductor process according to claim 2, wherein the dielectric layer comprises an oxide layer and the cap layer comprises a nitride layer.

5. The semiconductor process according to claim 1, wherein the dielectric layer comprises an inter-level dielectric layer.

6. The semiconductor process according to claim 1, wherein the shrinkable layer comprises an oxide layer.

7. The semiconductor process according to claim 1, wherein the shrinkable layer is formed by a flowable chemical vapor deposition (FCVD) process.

8. The semiconductor process according to claim 1, wherein the dishing has a depth, and the shrinkable layer has a thickness larger than the depth.

9. The semiconductor process according to claim 1, wherein the step of performing the treatment process to shrink the part of the shrinkable layer according to the topography of the second top surface comprises:
    measuring the topography of the second top surface of the shrinkable layer before the treatment process is performed.

10. The semiconductor process according to claim 9, wherein the topography is measured by a white light interference method or an atomic force microscopy (AFM) method.

11. The semiconductor process according to claim 1, wherein the topography has at least a relative high point, and the treatment process is only performed on the relative high point.

12. The semiconductor process according to claim 1, wherein the treatment process comprises a selective curing process.

13. The semiconductor process according to claim 12, wherein the treatment process comprises an annealing process.

14. The semiconductor process according to claim 13, wherein the treatment process comprises a laser beam annealing process.

15. The semiconductor process according to claim 14, wherein the laser beam annealing process has a power distribution corresponding to the second top surface of the shrinkable layer.

16. The semiconductor process according to claim 15, wherein the power distribution is a curve distribution of the power versus the second top surface of the shrinkable layer.

17. The semiconductor process according to claim 15, wherein the power distribution is a point distribution.

18. The semiconductor process according to claim 1, further comprising:
    performing a planarization process to planarize the shrinkable layer until the dielectric layer is exposed.

19. The semiconductor process according to claim 18, wherein the planarization process comprises a chemical mechanical polishing process.

20. The semiconductor process according to claim 18, wherein the dielectric layer has a flat top surface after the planarization process is performed.

* * * * *